United States Patent [19]

Mushinsky

[11] 4,071,820

[45] Jan. 31, 1978

[54] MEASUREMENT SYSTEM

[75] Inventor: Albert J. Mushinsky, Framingham, Mass.

[73] Assignee: Alton Corporation, Framingham, Mass.

[21] Appl. No.: 673,742

[22] Filed: Apr. 5, 1976

[51] Int. Cl.² .................................... G01R 27/26
[52] U.S. Cl. ............................................ 324/61 R
[58] Field of Search ............ 324/61 R, 61 QL, 34 D

[56] References Cited

U.S. PATENT DOCUMENTS

| 2,573,824 | 11/1951 | Baker | 324/61 R X |
| 3,609,735 | 9/1971 | Dauterman et al. | 324/61 R X |
| 3,769,666 | 11/1973 | Kaufman | 324/61 R X |

Primary Examiner—Stanley T. Krawczewicz

[57] ABSTRACT

A measuring system includes a capacitance sensor adapted to be positioned in proximity to an object to be observed, signal generating circuitry cooperating with the sensor for producing an electrical signal output indicative of a characteristic of the observed object, and signal processing circuitry for processing the signal generated by the signal generating circuitry. The signal processing circuitry has a power supply and a grounding system separate from the power supply and grounding system of the signal generating circuitry, and a receiving element coupled to but physically spaced from a transmitting element of the signal generating circuitry. The signal generating circuitry thus responds only to the electrical output signal from the signal generating circuitry as transmitted by the transmitting element and is not affected by system perturbations on the ground system adjacent the sensor or in the power supply in the signal generating circuitry.

15 Claims, 5 Drawing Figures

MEASUREMENT SYSTEM

SUMMARY OF INVENTION

This invention relates to measurement systems and more particularly to measurement systems that employ non-contact transducers.

Numerous systems have been developed for dimension measurement, for example for operational monitoring or for production inspection. Contact sensor systems rely on the actual motion of a sensor element to produce a measureable electrical signal, and are subject to several disadvantages, including low frequency response, limited dynamic range, and disturbance of the system under investigation (for example, deflection of the surface of an object or damage of that object by physical contact) so that meaningful measurement is not obtainable. Non-contact sensor systems have been proposed both as a solution to the foregoing difficulties and for additional applications, but substantial problems have been encountered in areas of calibration and standardization as such systems are highly dependent on environmental variations and the sensor elements themselves have an inherent non-linear sensitivity. The capacitance sensor is an example of a non-contact sensor which is extremely sensitive but highly temperature dependent and also dependent on dielectric conditions in the environment being monitored.

A particular problem arises in the measurement or monitoring of the surface profile of a rapidly rotating object of complex surface configuration. Blade clearance in turbine machinery is an example of such monitoring and measurement, and is an area of critical concern, both in the assembly and the operation of such equipment. Excessive clearance between the rotor blades and the surrounding shroud results in reduced engine efficiency, while contact between the blades and the surrounding shroud must be avoided. A typical jet engine rotor may include on hundred or more individual blades per stage, and measurements under dynamic conditions to accuracies as high as ± 200 microinches (0.2 mil) may be desired to provide individual blade tip radius data and rotor radius runout data.

The present invention provides an improved non-contact measuring system that provides accurate and versatile measurement of small dimensional values in an economical circuit arrangement that is convenient to operate.

A measuring system in accordance with the invention employs a non-contact sensor responsive to energy variation in the space between the sensor and the object being measured. Sensors useful in accordance with principles of the invention may be responsive to any energy manifestation which may be made to vary in a measurable way as a function of the relative spacing between a pair of closely spaced but non-contacting bodies. Thus the sensor may provide an electrical impedance which varies as a function of the rotor blade to sensor spacing, a variable reluctance, or other spacially sensitive energy variation. Coupled to the sensor is signal generating circuitry which produces an output electrical signal which varies as a function of the spacing between the sensor and the object to be measured. In a particular embodiment of the signal generating circuitry includes an oscillator which generates a carrier signal in the megahertz range. The non-contact sensor includes a capacitor component and is arranged so that its impedance varies as a function of the sensor-object spacing. This impedance variation is employed to modulate the megahertz carrier signal as a function of sensor-object spacing.

The system also incorporates signal processing circuitry which responds to the output electrical signal produced by the signal generating circuitry and modifies that signal as appropriate for display by an oscilloscope or an analog meter, or for application to data processing equipment. The signal processing circuitry has a power supply and grounding system separate from the power supply and grounding system of the signal generating circuitry. Further, the signal processing circuitry includes a receiving element that is coupled to but physically spaced from a transmitting element of the signal generating circuitry. The signal processing circuitry thus responds only to the electrical output signal from the signal generating circuitry as transmitted by the transmitting element and is not affected by system perturbations on the ground system adjacent the sensor, for example, or in the power supply of the signal generating circuitry. The transmitting and receiving element arrangement transfers signal energy as a function of sensor-object spacing, and while a number of different energy transmitting arrangements may be used, in a particularly embodiment the transmitting and receiving elements are inductively coupled coils.

In preferred embodiments, the signal processing circuitry includes a linearization stage which converts the nonlinear characteristics of the electrical output signal produced by the signal generating section to essentially linear characteristics, and a compensation stage that monitors the signal processed by the signal processing circuitry and generates a reference output as a function of the sensor environment, thus providing compensation for factors such as the temperature and the dielectric environment adjacent the probe tip. The resulting compensated output signal is linearized over a substantial range of signal values and the signal processing circuitry may include circuitry for selecting a portion of that linearized range for application to output devices.

In particular embodiments in which the electrical output signal is a modulated carrier, both the transmitting and receiving elements are tuned circuits that include inductively coupled coils. The signal processing circuit includes a detector stage which demodulates the modulated carrier, an operational amplifier linearization stage having an input network whose impedance varies as a function of the signal magnitude, and a compensation stage connected between the output of the linearization stage and the tuned receiving circuit that includes a voltage variable capacitance element connected to the tuned receiving circuit that varies the tuning of that circuit as a function of the magnitude of the output signal produced by the linearization stage during intervals when there is a large spacing between the sensor and the object to be measured. The valve of the linearized output signal is a direct function of the spacing between the sensor and the monitored object over a dimensional range from zero to values in excess of one-third of an inch and the signal changes 100 millivolts for each 1 mil change in spacing between the sensor and the monitored object.

The invention provides an improved non-contact measuring system which has a wide variety of applications in diverse industries. Such applications include the measurement and monitoring of thickness and runouts, and of moisture content, and physical counting and missing part determination functions. A particularly useful application is in the monitoring and/or measurement of rotor blade clearances in turbomachinery. The system has advantages of a high degree of accuracy, high frequency response, ease of calibration, and adaptability to automation. Preferred embodiments work well with both metallic and non-metallic objects.

Other objects, features and advantages of the invention will be seen as the following description of a particular embodiment progresses, in conjunction with the drawings, in which.

DESCRIPTION OF PARTICULAR EMBODIMENT

Figure 1:
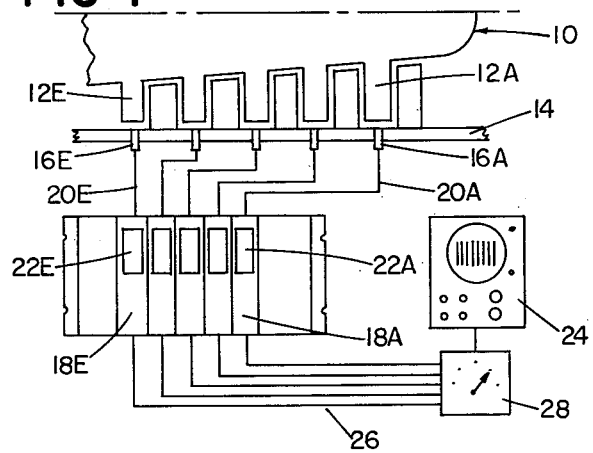
FIG. 1 is a diagrammatic showing of an application of the invention to the monitoring of blade clearance in an axial compressor.

Diagrammatically shown in FIG. 1 is a rotor 10 of an axial compressor that has five stages, each stage having a set of rotor blades 12 (A-E). Shroud 14 encloses the rotor blades and mounted on shroud 14 are five capacitance sensors 16 (A-E), each monitoring a corresponding stage of rotor blades 12. Each sensor 16 is connected to a corresponding measuring system module 18 (A-E) by a coaxial cable 20 (A-E). Each instrument module 18 includes an analog output indicator 22 and a terminal to which an output device such as an oscilloscope 24 or other high speed response equipment may be connected via cables 26 and selector switch 28 to the measuring system modules 18.

Figure 2:
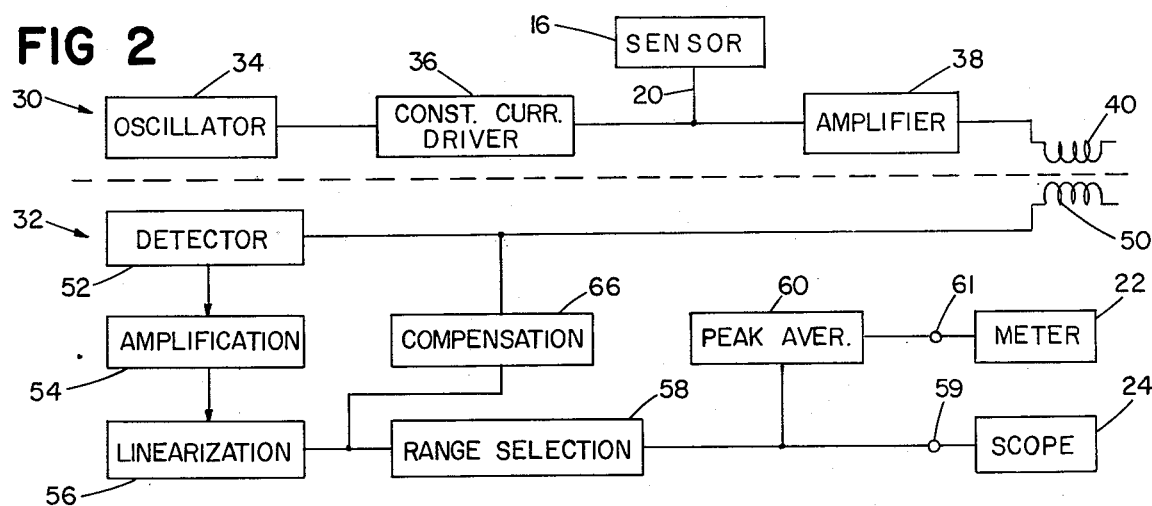
FIG. 2 is a block diagram of a measuring system in accordance with the invention.

The measuring system 18 is shown in block diagram form in FIG. 2. That system includes a signal generating section 30 and a signal processing section 32. The signal generating section includes oscillator 34 which generates a carrier signal at a frequency in the range of 10-12 megahertz and is coupled to constant current driver stage 36. Sensor 16 is coupled to constant current driver stage 36 by coaxial cable 20 and modulates the carrier signal generated by oscillator 34. That modulated carrier signal is applied to amplifier stage 38 whose output is applied to transmitting coil 40.

Signal processing section 32 includes receiving coil 50 that is physically spaced from but inductively coupled to transmitting coil 40, detector stage 52, amplifier stage 54, linearization stage 56, and range selection stage 58 which has a terminal 59 to which oscilloscope 24 may be connected via cable 26, and a peak averaging stage 60 to which analog meter 22 is connected via terminal 61. Compensation network 66 is connected between the output of linearization stage 56 and receiving coil 50. Sections 30 and 32 have separate DC power supplies and separate ground systems, and thus are completely isolated electrically from one another except for the inductive coupling of the modulated carrier signal via coils 40 and 50.

Figure 3:
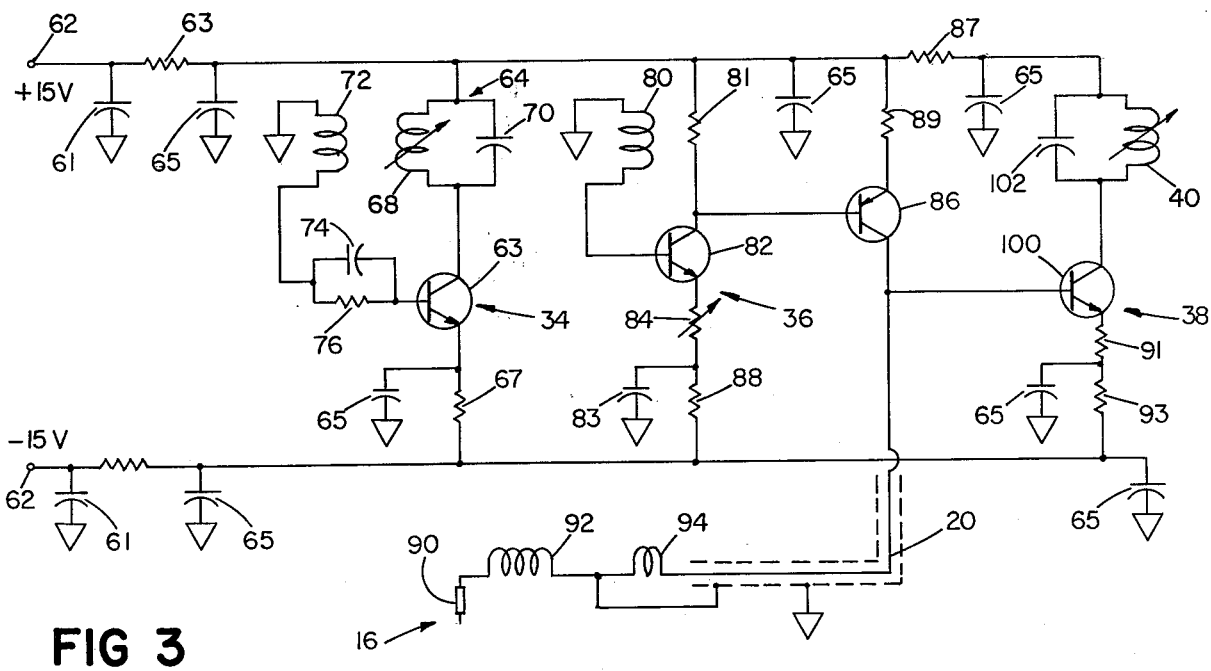
FIG. 3 is a schematic diagram of a particular embodiment of the signal generating circuitry of the system shown in FIG. 2.

Further details of a particular embodiment of the signal generating section 30 may be seen with reference to FIG. 3. Its regulated DC power supply is connected at terminals 62. The oscillator stage 34 includes transistor 63 and a resonant circuit 64 that includes tunable coil 68 and capacitor 70. Tuning of coil 68 controls the operating frequency of the oscillator which in this embodiment is adjustable over the range of 10-12 megahertz. Coil 72, inductively coupled to coil 68, provides feedback to the base of transistor 63. The constant current driver stage 36 includes coil 80 inductively coupled to coil 68, transistor 82, gain adjustment control 84, and transistor 86. Non-contact capacitance sensor 16 is connected via coaxial cable 20 to the collector of transistor 86. That sensor 16 includes a capacitive sensing element 90 at its tip which is connected in parallel with coil 92. A coupling loop 94 is inductively coupled to coil 92 and connected to cable 20. The change in impedance of sensor 16 is a function of the proximity of a sensed object, e.g. a turbine blade 12, to the capacitive sensing tip 90, and modulates the megahertz carrier signal. This modulated carrier signal is amplified by stage 38 which includes transistor 100. Connected to the collector of transistor 100 is a tuned transmitting circuit of transmitting coil 40 connected in parallel with capacitor 102. This transmitting circuit is tunable by adjustment of coil 40 and is peaked to the frequency of the carrier signal for maximum RF signal transmission.

Figure 4:
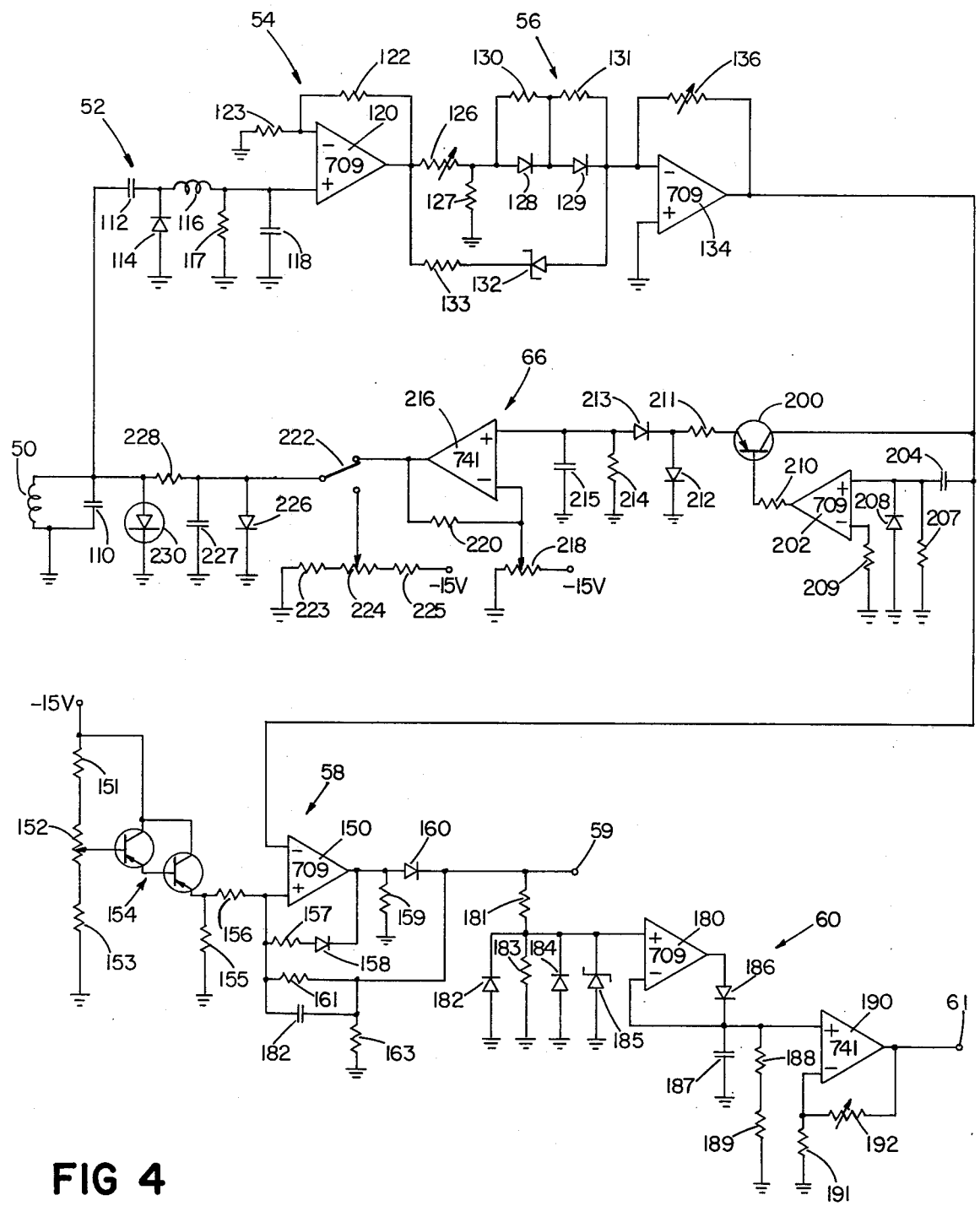
FIG. 4 is a schematic diagram of a particular embodiment of the signal processing circuitry of the measuring system shown in FIG. 2.

The signal processing section 32 associated with the signal generating section 30 of FIG. 3 is shown in FIG. 4. As indicated above, this section 32 has a regulated DC power supply separate from the power supply of the signal generating section 30 and a separate ground system, the only electrical coupling between two sections 30, 32 being the inductive coupling between the transmitting and receiving coils 40, 50. Receiving coil 50 is connected in parallel with capacitor 110 and is adjustable so that that circuit may be tuned. Preferably, the receiving circuit is tuned, not to the carrier frequency but to a frequency slightly below that carrier frequency. The tuned receiving circuit is connected to detector stage 52 which includes capacitor 112 and diode 114 and which provides as an output a demodulated signal. That demodulated signal is applied to buffer amplifier stage 54 which includes operational amplifier 120.

Linearization stage 56 has an input circuit that includes adjustable resistor 126 which provides gain adjustment, series diodes 128, 129, each bridged by a resistor 130, 131, and a parallel circuit that includes Zener diode 132 and resistor 133. The linearization stage also includes an operational amplifier 134 and adjustable feedback resistor 136. The demodulated and amplified signal has a logarithmic characteristic and that characteristic is linearized by stage 56 as a function of the breakdown voltages of diodes 128 and 129. The resulting output signal has essentially linear characteristics over an 8-volt range that corresponds to a range of spacings of the tip of probe 16 from the turbine blades 12 from zero to 360 mils.

Connected to the output of linearization stage 56 is amplification stage and range selection 58 that includes operational amplifier 150 and a selection network that includes resistors 151, 152 and 153 and a pair of buffer transistors 154. Stage 58 selects a one hundred-mil fraction of the 360-mil range of the output signal produced by linearization stage 56 and amplifies that selected fraction to produce at terminal 59 a linearized output over a ten-volt range that corresponds to the selected one hundred-mil fraction. Adjustment 152 changes the bias on amplifier 150 to shift the selected 100-mil fraction. The output signal level at terminal 59 changes 100 millivolts for each 1 mil changes in spacing between the tip of sensor 16 and the object being sensed.

Figure 5:
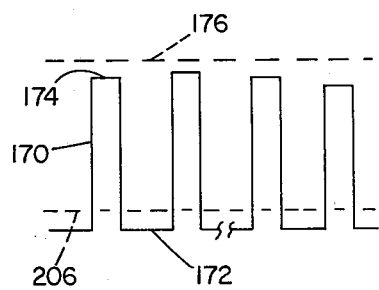
FIG. 5 is a diagram indicating the nature of the oscilloscope output generated by the measuring system shown in FIGS. 3 and 4.

When sensing a series of turbine blades 12, the system produces an output at terminal 59 in the form of a series of pulses 170 as indicated in FIG. 5. Each pulse 170 corresponds to a turbine blade 12 in the stage being monitored and the space between adjacent pulses indicates the corresponding gap between adjacent rotor blades. At each such gap, the sensed object (rotor 10) is spaced several inches from the tip of sensor 16 and the system produces an infinity output indication indicated by the signal level falling to reference level 172. The peak 174 of each pulse provides an indication of the spacing of the corresponding rotor blade 12 from the capacitive sensing tip 90 of sensor 16 as indicated by dashed line 176, peak 174B indicating closer spacing and peak 174D indicating greater spacing of the corresponding rotor blades.

A second system output from range selection stage 58 is applied through peak averaging stage 60 and terminal 61 to analog meter 22. Peak averaging circuit 60 includes operational amplifiers 180 and 190 and an RC network of capacitor 187 and resistors 188 and 189 that has a time constant in the order of 0.05 second and provides an analog output at terminal 61.

Compensation stage 66 is connected between the output of linearization stage 56 and receiving coil 50. This compensation stage includes transistor switch 200 that is controlled by comparator 202. The signal from linearization stage 56 is coupled by capacitor 204 and comparator 202 triggers transistor switch 200 into conduction whenever the output signal level of linearization stage 56 falls below a threshold level indicated by dashed line 206 in FIG. 5. Thus, when switch 200 is conducting, a turbine blade 12 is not opposite sensor 16 and the sensor-rotor spacing is so large that the output of linearization stage 56 indicates an infinity spacing (level 172). The magnitude of the reference level 172 is a function of the sensor environment including such factors as the temperature and dielectric conditions adjacent the probe tip. Environmental conditions may change significantly, for example, the temperature adjacent the probe tip over an operating cycle of the turbine changes from ambient to a temperature of several hundred degrees and shifts the reference level 172. The sensed reference level as passed by switch 200 is stored by capacitor 215 for application to operational amplifier 216. The bias on amplifier 216 is controlled by potentiometer 218 to select the peak value of the stored signal and blank other portions. The output of amplifier 216 is passed by switch 222 for storage by capacitor 227. Connected to storage capacitor 227 via resistor 228 is varactor 230, that is, a voltage variable capacitor. This voltage variable capacitor is connected in parallel with capacitor 110 of the tuned receiving circuit such that change in its capacitance as a function of the reference level signal stored by capactior 227 changes the tuning of the receiving circuit and thus adjusts the gain of the signal processing circuit as compensation for changes in the sensed reference level signal output of linearization stage 56.

Provision is made for manual compensation via switch 222 which is its second position is connected to a voltage divider network that includes potentiometer 224. The desired compensation level can be set by adjustment of potentiometer 224 when probe 16 is in infinity sensing condition.

In operation the carrier signal produced by oscillator 34 is modulated as a function of the spacing between the tip of probe 16 and the object being sensed. This modulated carrier signal is amplified and transmitted by tuned transmitting circuit 40 to tuned receiving circuit 50. The receiving signal is demodulated by detector 52 and modified by linearization stage 56 to provide a linearized output as a function of the spacing of sensor 16 from the object being sensed. Stage 58 responds to a selected portion of the output of stage 56 and adjusts the gain of the signal to correspond to a one hundred millivolt per mil measurement value; and that output signal is applied to the appropriate output devices such as analog meter 22 and/or oscilloscope 24.

The following is a table of suitable component values for use in the embodiment shown in FIGS. 3 and 4 and is provided in an illustrative and not in a limiting sense:

| Component | Value |
| --- | --- |
| Capacitor 61 | 12uf |
| Resistors 63 | 47 |
| Diodes 65 | 0.01 uf |
| Resistor 67 | 2K |
| Coil 68 | 10–20mh |
| Capacitor 70 | 270pf |
| Coil 72 | 10–20mh |
| Capacitor 74 | 100pf |
| Resistor 76 | 12K |
| Coil 80 | 10–20 mh |
| Resistor 81 | 680 |
| Capacitor 83 | 0.01uf |
| Resistor 84 | 250 |
| Resistor 87 | 47 |
| Resistor 88 | 2K |
| Resistor 89 | 222 |
| Resistor 91 | 150 |
| Resistor 93 | 1K |
| Capacitor 102 | 240pf |
| Capacitor 110 | 240pf |
| Capacitor 112 | 240pf |
| Diode 114 | 1N914 |
| Coil 116 | 15mh |
| Resistor 117 | 2K |
| Capacitor 118 | 360pf |
| Resistor 122 | 10K |
| Resistor 123 | 330 |
| Resistor 126 | 2K |
| Resistor 127 | 220 |
| Diode 128 | 1N914 |
| Diode 129 | 1N914 |
| Resistor 130 | 3K |
| Resistor 131 | 1.5K |
| Diode 132 | 1N753 |
| Resistor 133 | 270 |
| Resistor 136 | 20K |
| Resistor 151 | 10K |
| Resistor 152 | 10K |
| Resistor 153 | 10K |
| Resistor 155 | 3.3K |
| Resistor 156 | 10K |
| Resistor 157 | 2K |
| Diode 158 | 1N914 |
| Resistor 159 | 3.9K |
| Diode 160 | 1N914 |
| Resistor 161 | 33K |
| Capacitor 162 | 100pf |
| Resistor 163 | 6K |
| Resistor 181 | 2.2K |
| Diode 182 | 1N270 |
| Resistor 183 | 6.8K |
| Diode 184 | 1N270 |
| Diode 185 | 1N756 |
| Diode 186 | 1N914 |
| Capacitor 187 | 0.1uf |
| Resistor 188 | 390K |
| Resistor 189 | 100K |
| Resistor 191 | 2K |
| Resistor 192 | 20K |
| Capacitor 204 | 0.68uf |
| Resistor 207 | 47K |
| Diode 208 | 1N270 |
| Resistor 209 | 220 |
| Resistor 210 | 2K |
| Resistor 211 | 1K |
| Diode 212 | 1N270 |
| Diode 213 | 1N270 |

-continued

| Component | Value |
| --- | --- |
| Resistor 214 | 200K |
| Capacitor 215 | 5uf |
| Resistor 218 | 10K |
| Resistor 220 | 100K |
| Resistor 223 | 3K |
| Resistor 224 | 10K |
| Resistor 225 | 15K |
| Diode 226 | 1N914 |
| Capacitor 227 | 250uf |
| Resistor 228 | 4.7K |
| Diode 230 | 1N5455A |

The measuring system thus provides a low cost, highly accurate, quick response system suitable for a variety of applications including measuring, monitoring, equipment protection, and physical counting. While a particular embodiment of the invention has been shown and described, various modifications of the disclosed embodiment will be apparent to those skilled in the art and therefore it is not intended that the invention be limited to the disclosed embodiment or to details thereof and departures may be made therefrom within the spirit and scope of the invention.

What is claimed is:

1. In a measuring system that includes sensor means adapted to be positioned in proximity to but not in contact with an object to be observed, said sensor means being sensitive to variation in the sensor-to-object spacing, and signal generating circuitry cooperating with said sensor means for procuding an electrical signal output indicative of the spacing of the object from said sensor means, signal processing circuitry for processing the signal generated by said signal generating circuitry, said signal processing circuitry having a power supply and a grounding system separate from the power supply and grounding system of said signal generating circuitry, a tuned receiving circuit coupled to but physically spaced from a tuned transmitting circuit of the signal generating circuitry for receiving said electrical signal output from said signal generating circuitry and a compensation network coupled to said tuned receiving circuit for adjusting the tuning of said receiving circuit as a function of an output signal level corresponding to a condition of large spacing between said sensor means and the object to be sensed.

2. In a measuring system that includes sensor means adapted to be positioned in proximity to but not in contact with an object to be observed, said sensor means being sensitive to variation in the sensor-to-object spacing, and signal generating circuitry cooperating with said sensor means for producing a non-linear electrical signal output indicative of the spacing of the object from said sensor means, signal processing circuitry for processing the signal generated by said signal generating circuitry, a receiving element coupled to but physically spaced from a transmitting element of the signal generating circuitry for receiving said electrical signal output from said signal generating circuitry and a linearization stage for converting said non-linear electrical signal output to a signal of essentially linear characteristics.

3. The circuitry as claimed in claim 2 wherein said linearization stage includes a plurality of solid state elements connected to change the gain of the linearization stage as a function of magnitude of said non-linear electrical signal output.

4. The system as claimed in claim 3 wherein said linearization stage includes a DC amplifier that has an input network and a feedback network, said input network including a plurality of resistance elements and a plurality of diodes connected in parallel with corresponding resistance elements and for switching resistance elements out of the input network as a function of the magnitude of said non-linear electrical signal output.

5. The system as claimed in claim 4 wherein said signal processing circuitry further includes a range selection stage for selecting a portion of the range of the modified signal produced by said linearization stage.

6. A measuring system for sensing the surface profile of a rapidly rotating object of complex surface configuration comprising:

snesor means adapted to be positioned in proximity to but not in contact with the surface to be observed, said sensor means being sensitive to variation in the spacing between the sensor means and the surface to be observed, signal generating circuitry cooperating with said sensor means for producing an electrical signal output indicative of the spacing of the surface from said sensor means, said signal generating circuitry generating a carrier signal of megahertz frequency and said sensor means modulating said carrier signal, a transmitting element tuned to the carrier signal frequency for maximum RF signal transmission, and a signal processing section including a receiving element coupled to but physically spaced from said transmitting element of the signal generating circuitry for receiving said electrical signal output from said signal generating circuitry, said receiving element being tuned to a frequency close to but offset from said carrier frequency, said signal processing section further including compensation means responsive to a reference corresponding to a condition of large spacing between said sensor and the surface to be sensed for changing the tuning of said receiving element.

7. The system as claimed in claim 6 wherein said compensation means includes storage means for storing a signal corresponding to said reference signal, a switch connected in circuit between said storage means and said receiving element and a sensor connected to operate said switch in response to the sensing of a signal from said receiving element of magnitude corresponding to sid condition of large spacing to store a compensating signal in said storage means.

8. The system as claimed in claim 7 wherein said compensation means includes a voltage variable capacitor connected to said receiving element, said voltage variable capacitor being responsive to a change in said compensation signal to change the tuning of said receiving element.

9. A measuring system comprising:

signal generating circuitry for generating a carrier signal of megahertz frequency, a capacitance sensor adapted to sense a condition to be monitored and to modulate said carrier signal as a function of the sensed condition, an output circuit tuned to the frequency of said carrier signal, and signal processing circuitry including a receiving stage tuned to a frequency offset from said carrier frequency and having a receiving element physically spaced from and inductively coupled to a transmitting element of said output circuitry, a demodulator stage coupled to said receiving stage for producing a DC signal as a function of the modulation of said carrier signal, said DC signal having non-linear characteristics, a linearization stage responsive to said DC signal for producing a modified signal that is in essentially linear correspondence with a range of conditions sensed by said capacitor sensor, and a compensation network responsive to predetermined values of said modified signal corresponding to a reference signal from said sensor for modifying the tuning of said receiving stage.

10. The system as claimed in claim 9 wherein the grounding system and power supply of said signal processing circuitry are entirely separate from the power supply and grounding system and power supply of said signal generating circuitry.

11. The system as claimed in claim 9 wherein said compensation network includes storage means for storing a signal corresponding to said reference signal, a switch connected in circuit between said storage means and said linearization stage and a sensor connected to operate said switch in response to the sensing of a modified signal of magnitude corresponding to said reference signal to store compensating signal in said storage means.

12. The system as claimed in claim 9 wherein said compensation network includes a voltage variable capacitor connected to said receiving stage, said voltage variable capacitor being responsive to a change in said compensation signal to change the tuning of said receiving stage.

13. The system as claimed in claim 12 wherein said signal processing circuitry further includes a range selection stage for selecting a portion of the range of the modified signal produced by said linearization stage.

14. The system as claimed in claim 13 wherein said linearization stage, said compensation network and said range selection stage each include a DC amplifier.

15. The system as claimed in claim 14 wherein the DC amplifier in said linearization stage has an input network and a feedback network, said input network including a plurality of resistance elements and a plurality of diodes connected in parallel with corresponding resistance elements and for switching resistance elements out of the input network as a function of the magnitude of said non-linear DC signal.

* * * * *